(12) United States Patent
Kuenemund

(10) Patent No.: US 8,901,979 B2
(45) Date of Patent: Dec. 2, 2014

(54) STORAGE CIRCUIT

(71) Applicant: Infineon Technologies AG, Neubiberg (DE)

(72) Inventor: Thomas Kuenemund, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/089,780

(22) Filed: Nov. 26, 2013

(65) Prior Publication Data

US 2014/0145772 A1    May 29, 2014

(30) Foreign Application Priority Data

Nov. 26, 2012 (DE) .......................... 10 2012 111 414

(51) Int. Cl.
*G11C 11/41* (2006.01)
*H03K 3/037* (2006.01)

(52) U.S. Cl.
CPC .............. *G11C 11/41* (2013.01); *H03K 3/0372* (2013.01)
USPC ............................ 327/202; 327/225; 327/203

(58) Field of Classification Search
CPC .................................................... H03K 3/0372
USPC ......... 327/202, 199, 200, 203, 208, 210, 211, 327/212, 214, 215, 217, 218, 225
See application file for complete search history.

(56) References Cited

U.S. PATENT DOCUMENTS

| 4,417,328 A | 11/1983 | Ochii |
| 2002/0097069 A1 | 7/2002 | Dutta et al. |
| 2008/0218234 A1* | 9/2008 | Jain ............................... 327/202 |

FOREIGN PATENT DOCUMENTS

| DE | 3102799 A1 | 1/1982 |
| DE | 102004037591 A1 | 3/2006 |

OTHER PUBLICATIONS

German Office Action, dated Sep. 13, 2013; 5 pages.

* cited by examiner

*Primary Examiner* — Lincoln Donovan
*Assistant Examiner* — Jung H Kim

(57) ABSTRACT

In accordance with an embodiment, a description is given of a storage circuit including an input stage configured to provide a value to be stored, a storage stage configured to store the value to be stored, an output stage configured to output a value stored by the storage circuit, and a control circuit, wherein the control circuit is configured to receive a signal from the output stage, which signal indicates the charge state of the output stage, and, if the charge state of the output stage is equal to a predefined precharge state, to output an activation signal to the storage stage, and wherein the storage stage is configured to store the value to be stored, provided by the input stage, in reaction to the activation signal.

11 Claims, 11 Drawing Sheets

STORAGE CIRCUIT

CROSS-REFERENCE TO RELATED APPLICATION

This application claims priority to German Patent Application Serial No. 10 2012 111 414.5, which was filed Nov. 26, 2012, and is incorporated herein by reference in its entirety.

TECHNICAL FIELD

Various embodiments relate generally to a storage circuit.

BACKGROUND

In order to safeguard a security-relevant circuit against differential electromagnetic analysis (DEMA), there is the possibility of designing and controlling the circuit in such a way that specific line nodes are brought regularly (for example between each charging to a new value) to a precharge state.

Circuits which support such a functionality efficiently, for example with only a small increase in the processing speed, are desirable.

SUMMARY

In accordance with an embodiment, a description is given of a storage circuit including an input stage configured to provide a value to be stored, a storage stage configured to store the value to be stored, an output stage configured to output a value stored by the storage circuit, and a control circuit, wherein the control circuit is configured to receive a signal from the output stage, which signal indicates the charge state of the output stage, and, if the charge state of the output stage is equal to a predefined precharge state, to output an activation signal to the storage stage, and wherein the storage stage is configured to store the value to be stored, provided by the input stage, in reaction to the activation signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
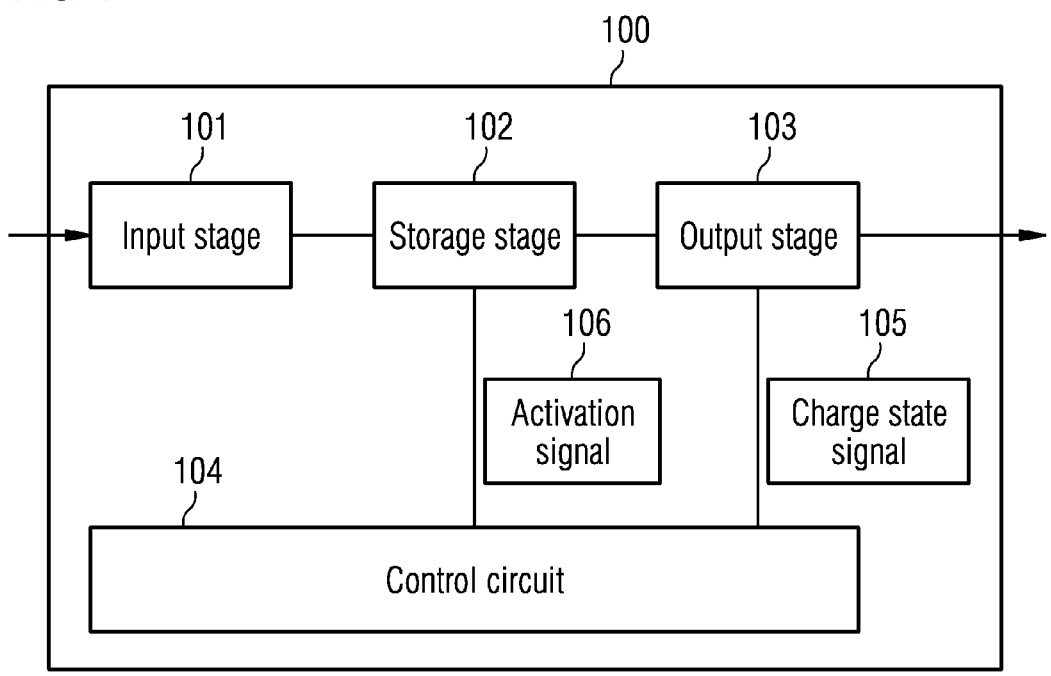
FIG. 1 shows a storage circuit in accordance with an embodiment.

The following detailed description relates to the accompanying figures showing details and embodiments. These embodiments are described in sufficient detail that a person skilled in the art can carry out the invention. Further embodiments are also possible and the embodiments can be modified from a structural, logical and electrical standpoint, without departing from the subject matter of the invention. The various embodiments are not necessarily mutually exclusive, rather different embodiments can be combined with one another to give rise to new embodiments.

Differential Electromagnetic Analysis (DEMA, or else Differential Power Analysis, DPA) is one of the most important methods for attacking (and for assessing the sensitivity of) integrated circuits (ICs) for security applications in relation to targeted attacks on "confidential" information such as passwords or cryptographic keys: for a given program or a given algorithm, measured electromagnetic field or emission profiles of the IC are evaluated by statistical methods, wherein—for a multiplicity of program executions—conclusions about the information to be protected can be drawn from the correlation of systematic data variation and the respective emission profiles.

One possibility for making DEMA attacks at least significantly more difficult consists in exchanging or transmitting data between subsystems of the IC as far as possible only in an encrypted manner. The best cryptosystem, because it is provably secure, is a so-called one-time pad masking: cleartexts $d=(d_1, d_2, \ldots)$ coded as bits are masked with masks $m=(m_1, m_2, \ldots)$ obtained from true random sequences 100110001011 . . . in accordance with $c=e(d, m)=(m_1 \oplus d_1, m_2 \oplus d_2, \ldots)$, i.e. a bit $c_j$ of the ciphertext $c=e(d, m)$ results from the XORing $m_j \oplus d_j$ of the corresponding bits of mask m and cleartext d. Owing to $m \oplus m=0$ and $0 \oplus m=m$, it holds true that $m_j \oplus c_j = d_j$; the demasking of c in order to recover the cleartext d takes place in accordance with the same bit-by-bit XORing.

For the one-time pad cryptosystem it is important that each key sequence is used only once in each case for masking and demasking, since otherwise information about cleartexts can be determined by statistical methods.

Switching networks and mechanisms are usually embodied microelectronically such that e.g. each bit of a state stored in a register is represented physically by exactly one electrical node at the register output. For what is therefore called "single-rail" circuit technology, the same also holds true for all nodes within the combinational switching networks between registers and for the inputs thereof: generally exactly one electrical node corresponds to the logic value of a (intermediate) state bit or the complement thereof.

In contrast to conventional "single-rail" logic, in which each bit within a data or signal path is represented physically by exactly one electrical node k of a switching network or switching mechanism, in the case of implementation with dual-rail logic each bit is represented by two nodes k and kq, said bit having a valid logic value if k corresponds to the true logic value b of said bits and kq corresponds to the negated value bn=not(b).

The desired resistance of a circuit using dual-rail logic toward DEMA can be achieved by a so-called precharge state being inserted between in each case two states having valid logic values (b, bn)=(1, 0) or (0, 1), for which precharge state both k and kq are charged to the same electrical potential, that is to say assume logically invalid values (1, 1) or (0, 0). For the precharge state (1, 1), a state sequence might appear for example as follows (where "→" symbolizes a state transition):

(1, 1)→(0, 1)→(1, 1)→(1, 0)→(1, 1)→(1, 0)→(1, 1)→(0, 1)→ . . . ,

For any arbitrary one of such state sequences it holds true that, upon each transition (1, 1)→(b, bn), exactly one node is subjected to charge reversal from 1 to 0, and for all (b, bn)→ (1, 1) exactly one node is subjected to charge reversal from 0 to 1, independently of the logically valid value b of the state bit in question. The same analogously holds true for state sequences with the precharge state (0, 0).

It follows from this, however, that the emission profiles corresponding to these state sequences are independent of the sequence (b, bn) of the logically valid values if care is only taken to ensure that the nodes k and kq are implemented symmetrically in the sense that they have identical driver and receiver circuits and identical electrical capacitances. The emission profile of a data path implemented in this way is therefore not dependent on temporal variations of the data to be processed: it is DEMA-resistant.

"Masked computation" using single-rail circuit technology has a significantly increased circuit outlay and hence higher area expenditure and higher energy consumption.

An embodiment provides an edge-triggered register standard cell having resistance to Differential Electromagnetic Analysis (DEMA) for security ICs (IC=Integrated Circuit) for semi-custom design methodology for IC implementation with a high degree of automation.

Full-custom implementations, by contrast, have a lower degree of automation of the design methodology (i.e. high outlay for circuit architecture, schematic entry, layout, functional verification, system integration and test) and an easier identifiability of security-critical subcircuits than semi-custom implementations.

A storage circuit in accordance with an embodiment is explained in greater detail below.

FIG. 1 shows a storage circuit 100 in accordance with an embodiment.

The storage circuit 100 has an input stage 101, for providing a value to be stored, a storage stage 102 for storing the value to be stored, and an output stage 103 for outputting a value stored by the storage circuit 100.

The storage circuit 100 furthermore includes a control circuit 104 configured to receive a signal (e.g. a charge state signal) 105 from the output stage 103, which signal indicates the charge state of the output stage 103, and, if the charge state of the output stage 103 is equal to a predefined precharge state, to output an activation signal 106 to the storage stage 102, wherein the storage stage 102 is configured to store the value to be stored, provided by the input stage 101, in reaction to the activation signal 106.

In other words, in accordance with an embodiment, in reaction to the fact that the output stage of a storage circuit attains a precharge state, the reading of a new value to be stored into the circuit is initiated. For this purpose, by way of example, at least one output signal of the output stage is fed back for controlling the storage stage.

In accordance with an embodiment, the storage circuit is compatible with the semi-custom design methodology and allows, for example, a characterization of the time behavior of output signals (e.g. Q and QN in the example below) of the storage circuit.

The signal (which indicates the charge state of the output stage) is, for example, an output data signal of the storage circuit.

The control circuit has, for example, a generating circuit designed for generating the activation signal from the signal.

The control circuit has, for example, a delay element designed for delaying the outputting of the activation signal to the storage stage. The delay element is dimensioned, for example, in such a way that the output stage assumes the precharge state for a predefined time duration.

The output stage has, for example, a first output for outputting a first output signal (e.g. output data signal) of the storage circuit and a second output for outputting a second output signal (e.g. output data signal) of the storage circuit, said second output signal being inverted relative to the first output signal.

The charge state of the output stage is, for example, equal to the predefined precharge state if the signal output by the first output and the signal output by the second output are equal to a predefined value.

The control circuit is designed, for example, for outputting the activation signal to the storage circuit if the signal output by the first output and the signal output by the second output are identical.

The charge state of the output stage is, for example, the charge state of at least one node of the output stage.

In accordance with an embodiment, the output stage is configured to receive a precharge signal and to precharge the at least one node in reaction to the reception of the precharge signal.

By way of example, the control circuit is configured to generate the precharge signal.

For example, the control circuit is configured to generate the precharge signal in reaction to a clock signal.

In accordance with an embodiment, the storage stage is a slave flip-flop.

The storage circuit furthermore includes, for example, a master flip-flop configured to store the value to be stored, provided by the input stage, wherein the slave flip-flop is configured to receive and store the value provided by the input stage from the master flip-flop in reaction to the activation signal.

An example of a storage circuit (also designated hereinafter as register circuit) is described in greater detail below.

Figure 2:
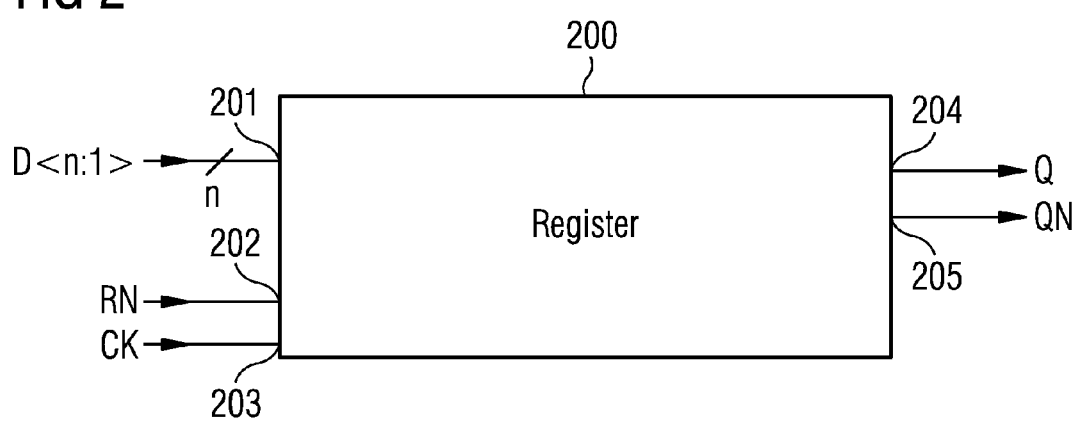
FIG. 2 shows a storage circuit in accordance with an embodiment.

FIG. 2 shows a storage circuit 200 in accordance with an embodiment.

The storage circuit is, for example, a register circuit, e.g. a flip-flop with self (temporally) regulated precharge.

The storage circuit 200 includes a data input 201 for receiving input data D having a width of n bits.

The storage circuit 200 furthermore includes an (asynchronous) reset input 202 for receiving a reset signal RN, a clock input 203 for receiving a clock signal CK, a first output 204 for outputting an output signal Q, and a second (inverting) output 205 for outputting the inverted output signal QN.

The n input bits are combined, for example, by an input stage of the storage circuit 200 to form a value to be stored, which, if it was accepted by a storage stage of the storage circuit 200 (i.e. was stored in the storage stage), is output as output signal Q at the first output 204.

Figure 3:
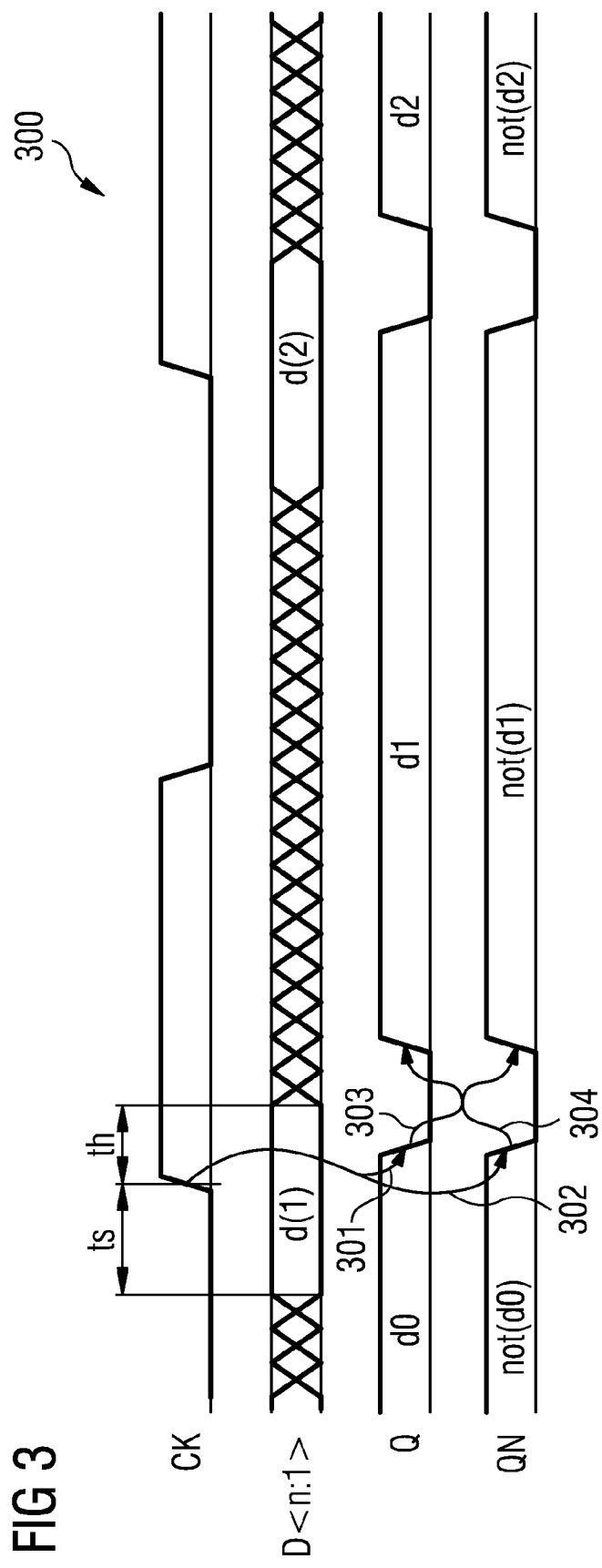
FIG. 3 shows a signal diagram in accordance with an embodiment.

One example of a signal profile is illustrated in FIG. 3.

FIG. 3 shows a signal diagram 300.

The signal diagram 300 shows the profile of the clock signal CK, of the data signal D<n:1>, of the output signal Q and of the inverted output signal QN.

It is assumed hereinafter that the logic value 0 corresponds to the lower supply potential VSS and the logic value 1 corresponds to the upper supply potential VDD.

The input signal D has a set-up time $t_s$ and a hold time $t_h$ with respect to the rising edge of the clock signal CK.

Both output signals Q and QN, triggered by the rising edge of CK, are firstly put into a predefined precharge state (illustrated by arrows 301 and 302). In this example, both Q and QN assume the precharge state 0.

Said precharge state of Q and QN initiates the asynchronous enabling of the new complementary values Q=f(D<n:1>), QN=not[Q] determined with the last rising edge of the clock signal CK beforehand from D<n:1>, for example by an input stage, wherein f(D<n:1>) denotes a (Boolean) logic combination of the n input signals D<n:1>, such that these are accepted into a storage stage and are present at the outputs 204, 205 (illustrated by arrows 303, 304).

In this example, the input data are successively d(0) (not shown in the signal profile of D<n:1>), d(1) and d(2), each having n bits. The values correspondingly determined therefrom by the input stage are designated as d0, d1 and d2.

The asynchronous enabling of Q=f(D<n:1>), QN=not[Q] is effected for example by means of a cell-internal feedback of (Q, QN) to a likewise cell-internal activation signal (or enable signal).

The further profile upon changing from the input data d(1) to the input data d(2) is carried out analogously.

An implementation of the storage circuit 200 in accordance with an embodiment is described below.

Figure 4:
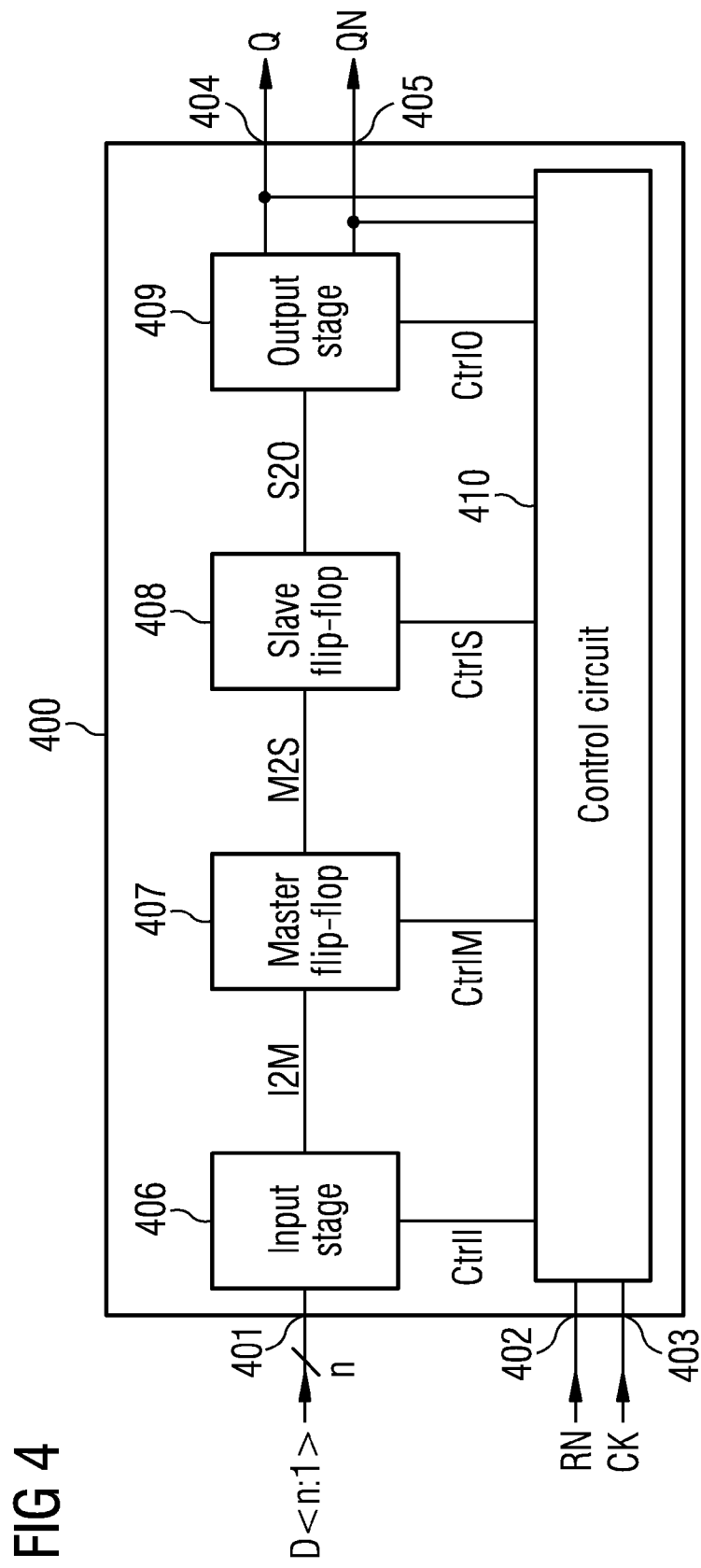
FIG. 4 shows a storage circuit in accordance with an embodiment.

FIG. 4 shows a storage circuit 400.

In a manner corresponding to FIG. 2, the storage circuit 400 includes a data input 401, an (asynchronous) reset input 402, a clock input 403, a first output 404 and a second output 405, via which the storage circuit 400 receives and outputs signals as described with reference to FIG. 2.

The storage circuit includes an input stage 406, a master flip-flop (e.g. a master latch) 407, a slave flip-flop (e.g. a slave latch) 408, an output stage 409 and a control unit (i.e. control circuit) 410.

The input stage receives the input data D<n:1> and converts them into one or more input signals I2M for the master flip-flop 407, the data outputs of which are connected to the data inputs of the slave flip-flops 408 and via which the output signal M2S of the master flip-flop 407 is output. The slave flip-flop 408 in turn is connected on the output side to the output stage 409 and outputs an output signal S2O to the output stage 409. The output stage 409 outputs the output signals Q and QN of the storage circuit 400. The output signals Q and QN are additionally fed back into the control unit 410, which additionally receives the reset signal RN and the clock signal CK and supplies the control signal CtrlI to the input stage 406, the control signal CtrlM to the master flip-flop 407, the control signal CtrlS to the slave flip-flop 408 and the control signal CtrlO to the output stage 409.

A concrete implementation of the storage circuit 400 is described below.

Figure 5:
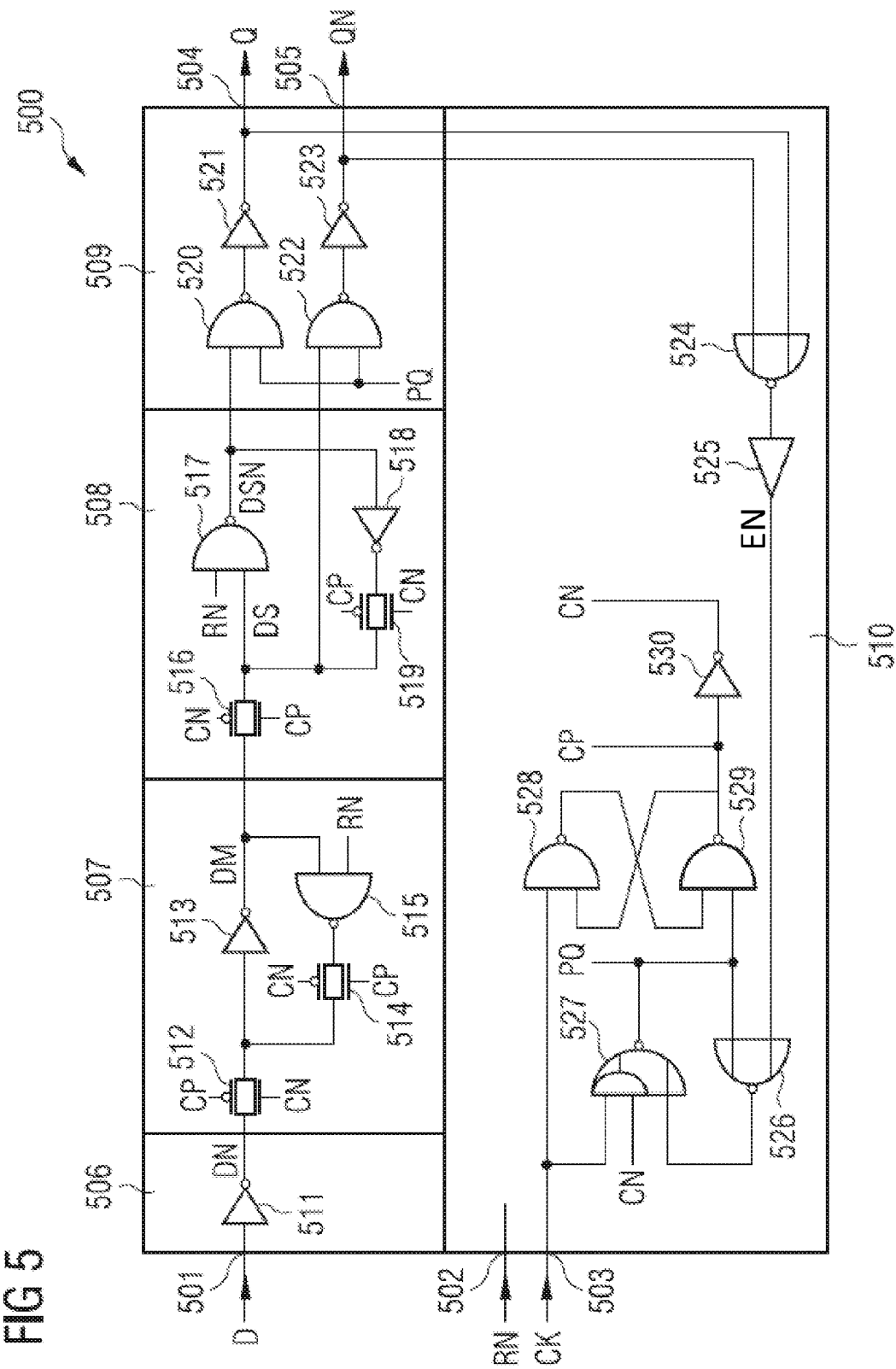
FIG. 5 shows a storage circuit in accordance with an embodiment.

FIG. 5 shows a storage circuit 500.

The storage circuit 500 corresponds to the storage circuit 400 and correspondingly includes inputs and outputs 501 to 505 analogously to the inputs and outputs 401 to 405, via which signals D, RN, CK, Q, QN are input and output, wherein in this example the input data signal D=D<1:1> is only an individual bit.

Analogously to the storage circuit 400, the storage circuit 500 furthermore includes an input stage 506, a master flip-flop (e.g. a master latch) 507, a slave flip-flop (e.g. a slave latch) 508, an output stage 509 and a control unit 510.

The input stage 506 has merely a first inverter 511 for generating the inverse signal DN with respect to D. The master flip-flop 507 and the slave flip-flop 508 are embodied as in a typical CMOS register circuit with inputs for the control signals CN and CP (that is to say complementary clock inputs), and inputs for the (active low) reset signal RN.

In specific detail, the master flip-flop 507 has at its data input a first transmission gate 512, the output of which is coupled to a second inverter 513, the output of which forms the output of the master flip-flop 507 and outputs the output signal of the master flip-flop DM. The first transmission gate receives CP at its inverting input (i.e. the gate of the p-channel field effect transistor) and CN at a non-inverting input (i.e. the gate of the n-channel field effect transistor). The output of the first transmission gate 512 is furthermore coupled by means of a second transmission gate 514 to the output of a first NAND (i.e. NOT AND) gate 515, which has the reset signal RN and the output signal of the master flip-flop DM as input signals. The second transmission gate 514 receives CN at its inverting input and CP at a non-inverting input.

The slave flip-flop 508 has a third transmission gate 516 at its input. The output of the third transmission gate 516 forms the (non-inverting) output of the slave flip-flop 508, via which the (non-inverted) output signal of the slave flip-flop DS is output. The third transmission gate 516 receives CN at its inverting input and CP at a non-inverting input.

A second NAND gate 517 receives the output signal DS and the reset signal RN. The output of the second NAND gate 517 forms the inverting output of the slave flip-flop 508, via which the inverted output signal of the slave flip-flop DSN is output.

The inverted output signal of the slave flip-flop DSN is fed to a third inverter 518, which is coupled via a fourth transmission gate 519 to the output of the third transmission gate 516. The fourth transmission gate 519 receives CP at its inverting input and CN at a non-inverting input.

The output stage 509 has a third NAND gate 520, the output of which is coupled to a fourth inverter 521, the output of which forms the first (non-inverting) output of the storage circuit 500.

The output stage 509 has a fourth NAND gate 522, the output of which is coupled to a fifth inverter 523, the output of which forms the second (inverting) output of the storage circuit 500. The third NAND gate 520 receives the signal DSN and a signal PQ as input. The fourth NAND gate 522 receives the signal DS and the signal PQ as input. The control signal PQ serves for precharging the two data outputs 504, 505.

The two output signals Q, QN are fed to a first NOR (i.e. NOT OR) gate 524 of the control unit 510. The output signal of the first NOR gate 524 is fed to a delay element 525. The delayed output signal, which is designated by EN, is fed to a second NOR gate 526.

The control unit 510 furthermore has an AND-NOR gate 527 (i.e. a gate having two ANDed inputs, the AND combination of which is NOR-combined with a third input), which receives the signals CK and CN at its ANDed inputs and which receives the output signal of the second NOR gate 526 at its third input. The output signal of the AND-NOR gate 527 is the signal PQ, which is also fed to the second NOR gate 526. The signal PQ is additionally fed together with the output signal of a fifth NAND gate 528 to a sixth NAND gate 529. The output signal of the sixth NAND gate 529 and the signal CK are the input signals of the fifth NAND gate 528. The output signal of the sixth NAND gate is the signal CP, which is fed to a sixth inverter 530, which generates the signal CN therefrom.

Figure 6:
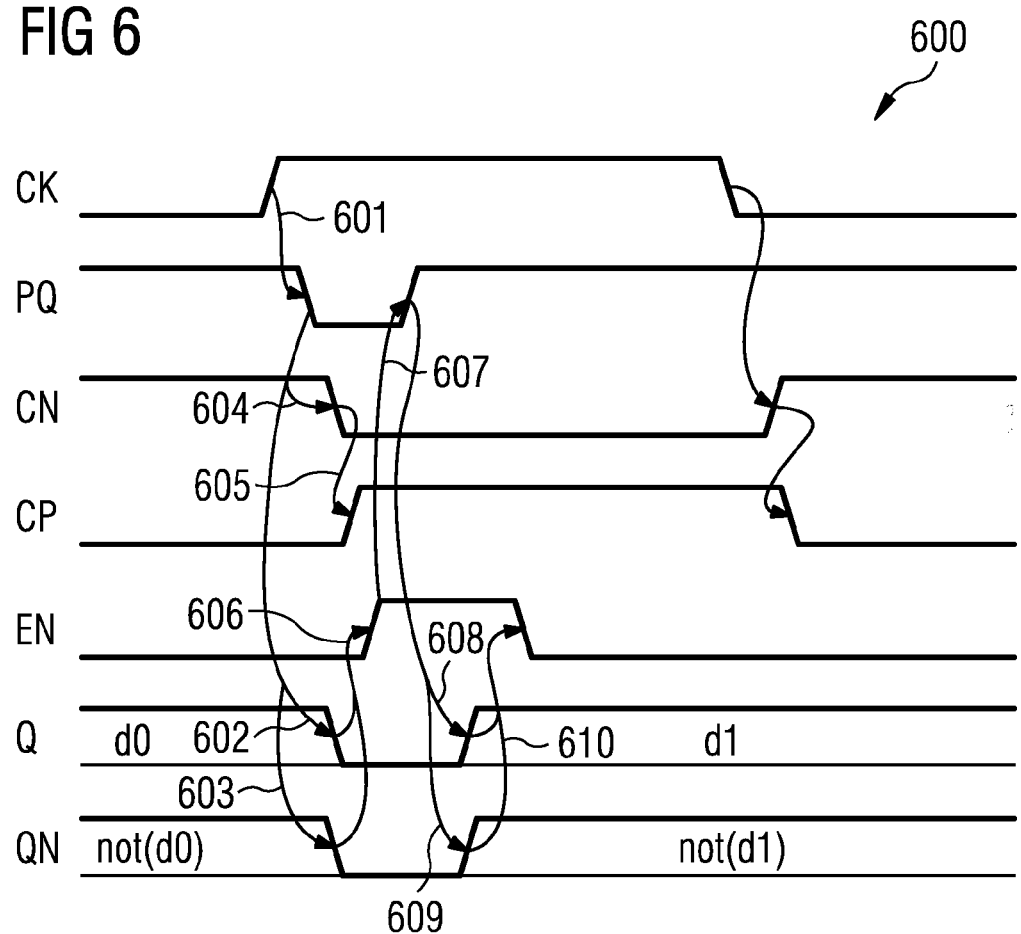
FIG. 6 shows a signal diagram in accordance with an embodiment.

The profile of the signals of the storage circuit 500 is illustrated in FIG. 6.

FIG. 6 shows a signal diagram 600.

The signal diagram 600 shows the profile of the signals CK, PQ, CN, CP, EN, Q and QN.

The rising edge of the clock input CK firstly results in the falling edge of PQ (illustrated by arrow 601), whereby the data outputs Q, QN are put into the precharge state (Q, QN)= (0, 0) (arrows 602 and 603). It is only with this falling edge of PQ that the internal complementary clock signals CN and CP (arrows 604, 605) switch, as a result of which, as is customary for edge-triggered registers, the master flip-flop 507 is disconnected from its data input and the data input of the slave flip-flop 508 is connected to the data output of the master flip-flop 507, that is to say that, for example, the slave latch accepts the value from the master latch. However, this new value does not appear at the data outputs 504, 505 until after the precharge state (Q, QN)=(0, 0) thereof has set the internal control signal EN to 1 (arrow 606) via the internal feedback (via the first NOR gate 524 and the delay element 525), which in turn triggers the rising edge of PQ (arrow 607), consequently switches off the precharge state (Q, QN)=(0, 0) (arrows 608, 609) and thus also switches off the EN signal again (arrow 610).

Further examples of the input stage 406, the master flip-flop 407, the slave flip-flop 408, the output stage 409 and the control unit (or control circuit) 410 are described below with reference to FIG. 7 to FIG. 9. In the following example, each stage of the data path of the register (from the output of the input stage 406 to the data outputs 404, 405) is implemented completely using charge-neutral dual-rail circuit technology with precharge states.

Figure 7:
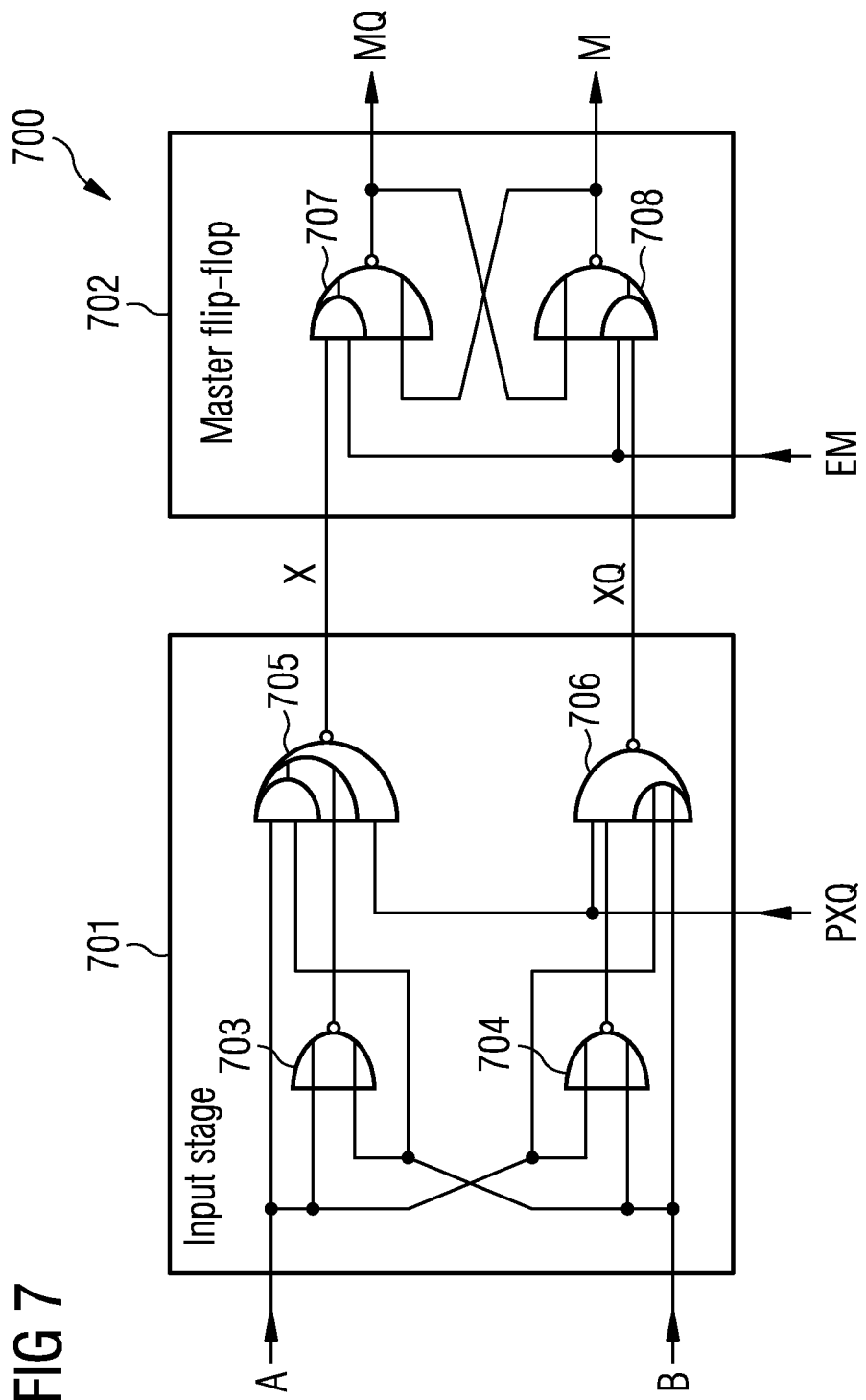
FIG. 7 shows an input stage and a master flip-flop in accordance with an embodiment.

FIG. 7 shows an input stage 701 and a master flip-flop 702.

In this example, the input data signal D<n:1>=D<2:1> has a width of two bits, which are designated as A and B.

The input stage logically combines the two input bits A and B. In this example it has an XOR circuit with precharge functionality and single-to-dual-rail conversion.

In specific detail, the input stage 701 has a NOR gate 703 and a NAND gate 704. Furthermore, the input stage 701 has an AND-OR-NAND gate 705, which ANDs two inputs, ORs the result with a third input and NANDs the result of the ORing with a fourth input. The output signal of the AND-OR-NAND gates 705 forms the non-inverting output signal of the input stage 701. The input stage 701 furthermore has an OR-NAND gate 706, which ORs two inputs and NANDs the result with two further inputs. The output signal of the OR-NAND gate 706 forms the inverting output signal of the input stage 701.

The input data signal A is fed to the NOR gate 703, to the NAND gate 704, to one of the ANDed inputs of the AND-OR-NAND gate 705 and to one of the ORed inputs of the OR-NAND gate 706.

The input data signal B is fed to the NOR gate 703, to the NAND gate 704, to one of the ANDed inputs of the AND-OR-NAND gate 705 and to one of the ORed inputs of the OR-NAND gate 706.

The output signal of the NOR gate 703 is fed to the ORed input of the AND-OR-NAND gate 705. The output signal of the NAND gate 704 is fed to one of the NANDed inputs of the OR-NAND gate 706.

A PXQ signal is fed to the NANDed input of the AND-OR-NAND gate 705 and to one of the NANDed inputs of the OR-NAND gate 706.

The following arises as a result

X=NOT(PXQ and (XNOR(A, B))), XQ=NOT(PXQ and (XOR(A, B))), i.e. for PXQ=0 it holds true that (X, XQ)=(1, 1), and for PXQ=1 it holds true that (X, XQ)=(XOR(A, B), XNOR(A, B)).

The master flip-flop 702 is embodied as an RS latch having the input signals X and XQ, an activation signal (enable signal) EM and output signals M and MQ.

The master flip-flop 702 has a first AND-NOR gate 707 and a second AND-NOR gate 708.

The first AND-NOR gate 707 receives the signal X and the signal EM at its ANDed inputs and the output signal of the second AND-NOR gate 708 at its NORed input and outputs the (inverted) output signal MQ.

The second AND-NOR gate 708 receives the signal XQ and the signal EM at its ANDed inputs and the output signal of the first AND-NOR gate 707 at its NORed input and outputs the (non-inverted) output signal M.

Consequently, the master flip-flop 702 has the following behavior:

for EM=0 the master flip-flop 702 holds the data last written at the data outputs M, MQ;

for EM=1 and (X, XQ)=(1, 1) it holds true that (M, MQ)= (0, 0), i.e. (M, MQ) assume their precharge state, and for EM=1 and complementary data inputs (X, XQ)=(XOR (A, B), XNOR(A, B)), these are accepted into the master flip-flop 702: (M, MQ)=(X, XQ).

Figure 8:
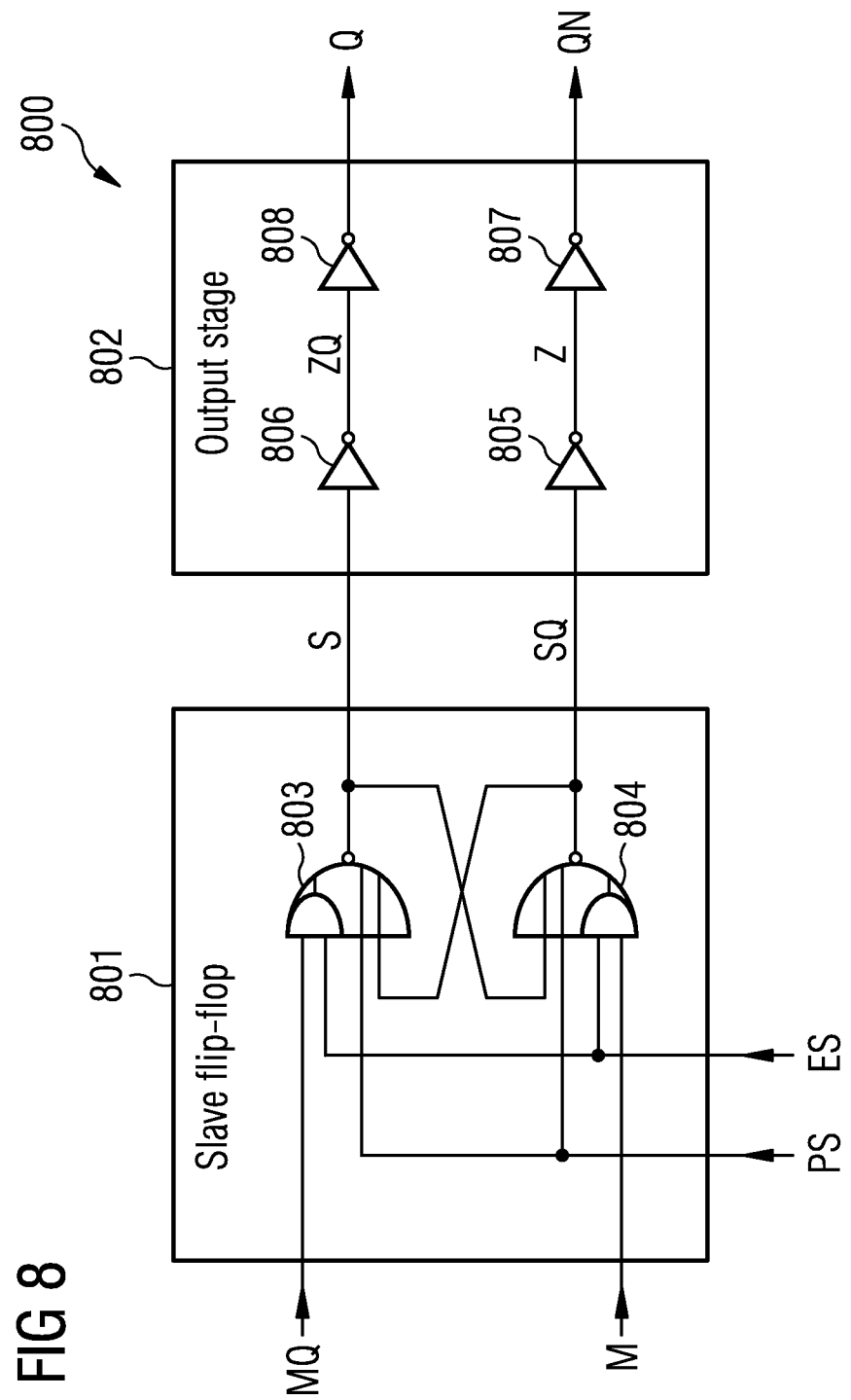
FIG. 8 shows a slave flip-flop and an output stage in accordance with an embodiment.

FIG. 8 shows a slave flip-flop 801 and an output stage 802.

The output stage 802 is a driver stage in this example.

The slave flip-flop 801 is embodied as an RS latch having the data inputs M and MQ, the enable signal ES, a precharge signal PS and output signals S and SQ.

The slave flip-flop 801 has a first AND-NOR gate 803, which ANDs two inputs and NORs the result with two further inputs, and a second AND-NOR gate 804, which ANDs two inputs and NORs the result with two further inputs.

The signal MQ is fed to one of the ANDed inputs of the first AND-NOR gate 803. The signal M is fed to one of the ANDed inputs of the second AND-NOR gate 804.

The signal PS is fed to a NORed input of the first AND-NOR gate 803 and to a NORed input of the second AND-NOR gate 804.

The signal ES is fed to an ANDed input of the first AND-NOR gate 803 and to an ANDed input of the second AND-NOR gate 804.

The output signal of the first AND-NOR gate 803 is the output signal S, which is additionally fed to a NORed input of the second AND-NOR gate 804.

The output signal of the second AND-NOR gate 804 is the output signal SQ, which is additionally fed to a NORed input of the first AND-NOR gate 803.

Consequently, the slave flip-flop 801 has the following behavior:

for PS=1 it holds true that (S, SQ)=(0, 0), i.e. (S, SQ) assume their precharge state;

for PS=0 and ES=0, the slave flip-flop 801 holds the data written last at its data outputs S and SQ, and for PS=0 and ES=1, complementary data inputs (M, MQ) are accepted into the slave flip-flop 801: (S, SQ)=(M, MQ).

The output stage has a first inverter 805, a second inverter 806, a third inverter 807 and a fourth inverter 808. The first inverter 805 receives the signal SQ on the input side. The output signal of the first inverter 805 is fed to the third inverter 807, which generates the (inverted) output signal QN therefrom. The second inverter 806 receives the signal S on the input side. The output signal of the second inverter 806 is fed to the fourth inverter 808, which generates the output signal Q therefrom.

In this example, the output stage 802 serves merely as a driver stage for the two data outputs 404, 405 of the storage circuit.

Figure 9:
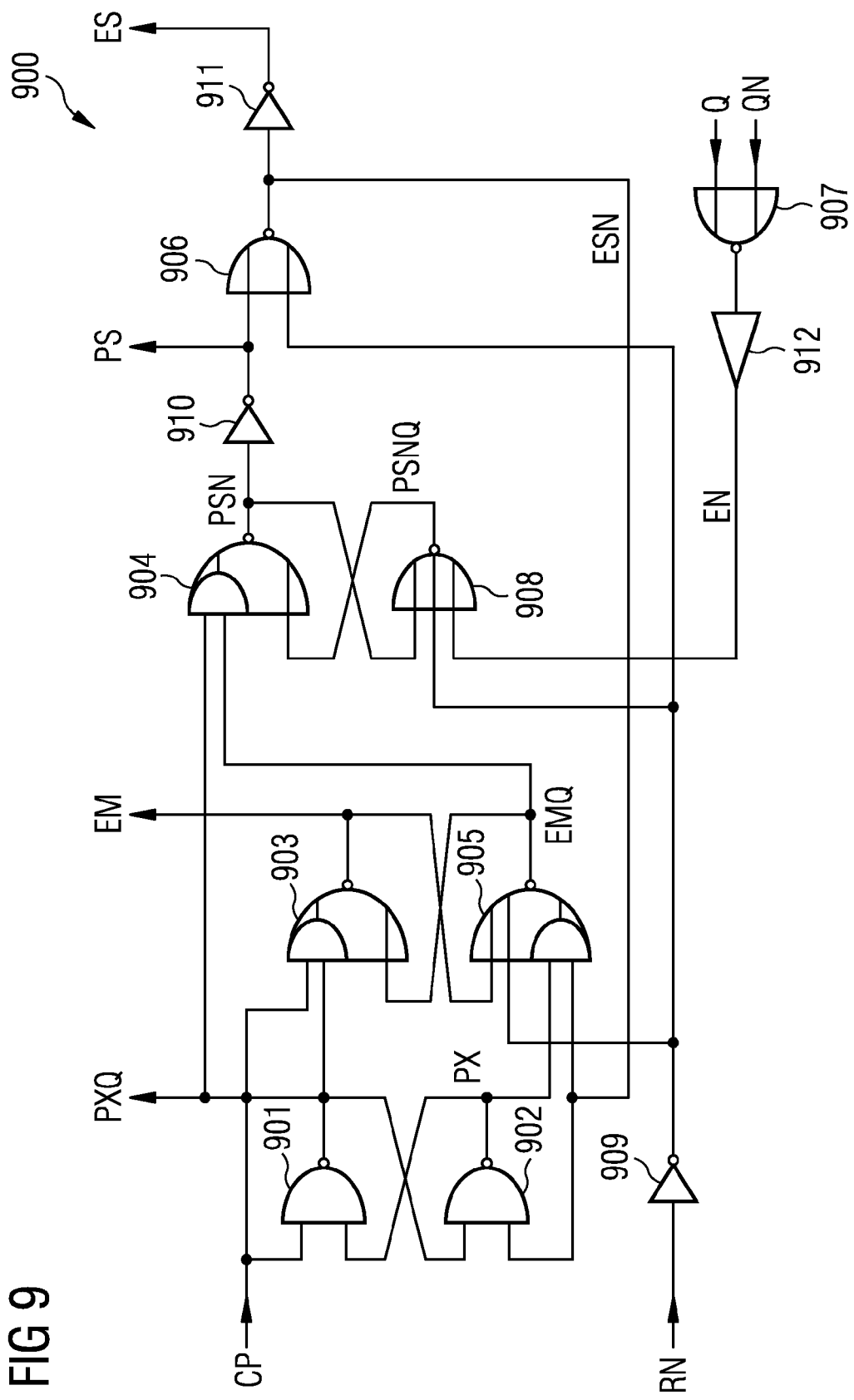
FIG. 9 shows a control unit in accordance with an embodiment.

FIG. 9 shows a control unit 900 in accordance with an embodiment.

The control unit 900 serves for generating the control signals PXQ, EM, PS and ES for the data path.

The control unit 900 has a first NAND gate 901, a second NAND gate 902, a first AND-NOR gate 903 and a second AND-NOR gate 904, which in each case AND two of their inputs and NOR the result with a third input, a third AND-NOR gate 905, which ANDs two of its inputs and NORs the result with two further inputs, a first NOR gate 906 and a second NOR gate 907 and also a third NOR gate 908 having three inputs, a first inverter 909, a second inverter 910, a third inverter 911 and a delay element 912.

The first NAND gate 901 receives the signal CN and the output signal of the second NAND gate PX as input signals and outputs the signal PXQ. The second NAND gate 902 receives the signal PXQ and the output signal of the first NOR gate ESN as input signals.

The first AND-NOR gate 903 receives the signal CP and the signal PXQ at its ANDed inputs and the output signal of the third AND-NOR gate EMQ at its NORed input.

The second AND-NOR gate 904 receives the signal PXQ and the output signal of the third AND-NOR gate EMQ as input signals for its ANDed inputs and the output signal of the third NOR gate PSNQ as input signal for its NORed input.

The third AND-NOR gate 905 receives the signal PX and the signal ESN at its ANDed inputs and the output signal of the first inverter 901 and the signal EM at its NORed inputs.

The first NOR gate 906 receives the output signal of the first inverter 909 and the output signal of the second inverter PS as input signals.

The second NOR gate 907 receives Q and QN as input signals. The output signal of the second NOR gate 907 is fed to the delay element 912, which outputs the signal EN.

The third NOR gate 908 receives the output signal of the first inverter, the signal EN and the output signal of the second AND-NOR gate PSN as input signals.

The first inverter 909 receives the signal RN as input signal. The second inverter 910 receives the signal PSN as input signal. The third inverter 911 receives the signal ESN as input signal and generates the signal ES therefrom.

Figure 10:
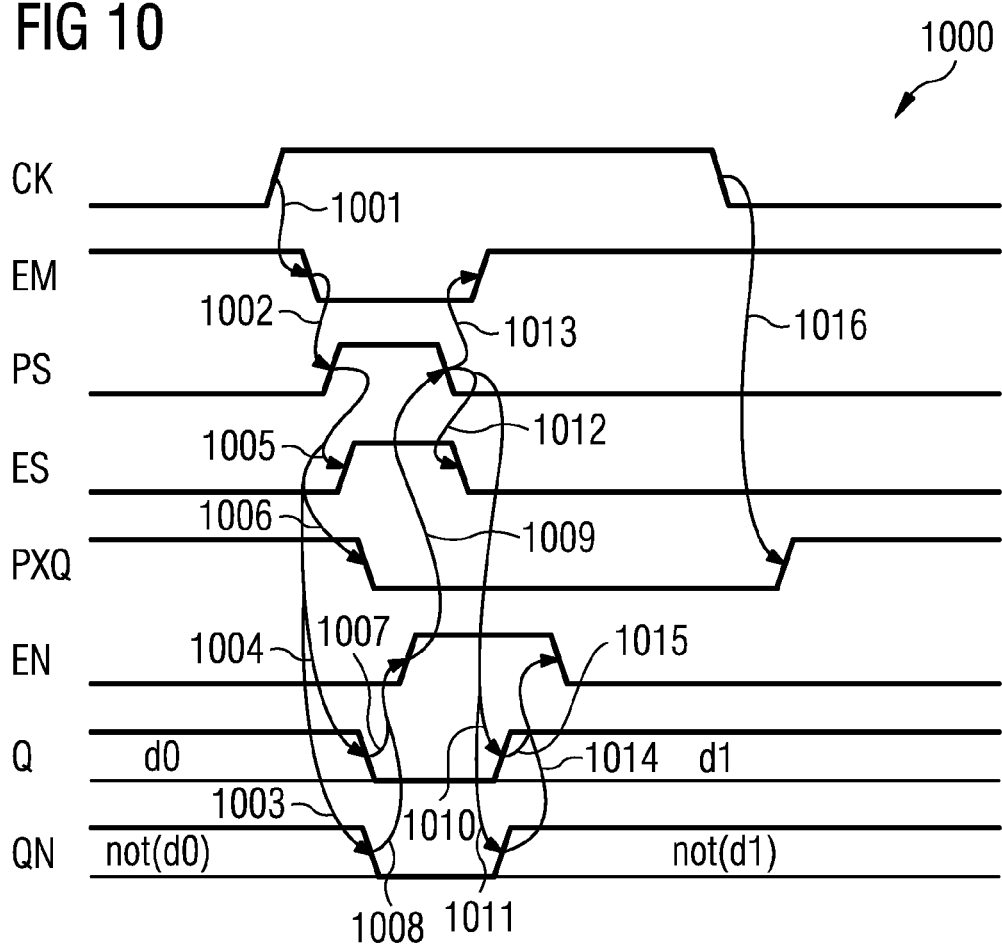
FIG. 10 shows a signal diagram in accordance with an embodiment.

FIG. 10 shows a signal diagram 1000.

The signal diagram 1000 shows the profile of the signals CK, EM, PS, ES, PXQ, EN, Q and QN.

In the initial state (reset signal RN inactive, i.e. RN=1 and clock input CK=0) the control signals assume the following values:

PXQ=1 (precharge of the input stage 701 inactive),
EM=1 (master flip-flop 702 accepts data from the input stage 701),
PS=0 (precharge of the slave flip-flop 801 inactive),
ES=0 (slave flip-flop 801 holds the data accepted last from the master flip-flop 702).

For the following it is firstly assumed that the reset signal RN remains inactive, i.e. RN=1.

With the rising clock edge of the signal CK to 1, firstly the falling edge EM to 0 is generated (illustrated by arrow 1001), that is to say that the master flip-flop 702 is separated from its data inputs, thereby achieving a minimum hold time for the data inputs A and B relative to the transition of CK to 1.

From this there follows the rising edge PS to 1 (arrow 1002), i.e. the slave flip-flop 801 undergoes transition to its precharge state; consequently, there follows the transition of (Q, QN) to (0, 0) (arrows 1003, 1004).

From this there follows firstly the rising edge ES to 1 (arrow 1005), i.e. the slave flip-flop 801 is ready for accepting data from the master flip-flop 702 (with the next falling edge PS to 0, see below), and secondly the falling edge of PXQ to 0 (arrow 1006), whereby the input stage 701 is put into the precharge state (X, XQ)=(1, 1).

From this there follows the rising edge of EN to 1 as a consequence of the transition of (Q, QN) to (0, 0) (arrows 1007, 1008).

From this there follows the falling edge of PS to 0 (arrow 1009), whereby the slave flip-flop 801 owing to ES=1 accepts the data from the master flip-flop 702 (arrows 1010, 1011).

From this there follows the falling edge of ES to 0 (arrow 1012), i.e. the slave flip-flop 801 is separated from the master flip-flop 702.

Furthermore, there follows the rising edge of EM to 1 (arrow 1013), i.e. the master flip-flop 702 is ready for accepting data from the input stage (with the next rising edge of PXQ to 1, see below).

In addition, the acceptance of the data leads to the falling edge of EN (arrows 1014, 1015).

The next rising edge of PXQ to 1, finally, is generated with the following falling clock edge of CK to 0 (arrow 1016), whereby the master flip-flop 702 accepts data from the input stage 701.

The register, as far as its control signals are concerned, is thus in the above-described initial state again.

The function of the asynchronous reset signal RN consists (in this example) in transparently switching the register for RN=0, i.e. ensuring that (Q, QN)=(XOR(A, B), XNOR(A, B)). In other words, for RN=0 the storage function of the circuit is switched off, and the combinational function (Q, QN)=(XOR(A, B), XNOR(A, B)) is effected instead.

Alternatives thereto, not explicitly illustrated here, consist e.g. in ensuring, for RN=0, that the data outputs of the register assume the logic value 0, that is to say (Q, QN)=(0, 1), or that (Q, QN)=(0, 0) then holds true, that is to say that the data outputs of the register assume their precharge state.

The feedback—shown in FIG. 5 and FIG. 9—of the data outputs Q and QN for generating the internal control signal EN consists, in the above examples, of a NOR gate (first NOR gate 524 in FIG. 5 and second NOR gate 907 in FIG. 9) and a delay element 525, 912, e.g. a gate for signal delay. For the temporal symmetry of the generation of the rising and falling edges of EN, it can be advantageous here to use a symmetrically implemented NOR gate. One example thereof is indicated in FIG. 11.

Figure 11:
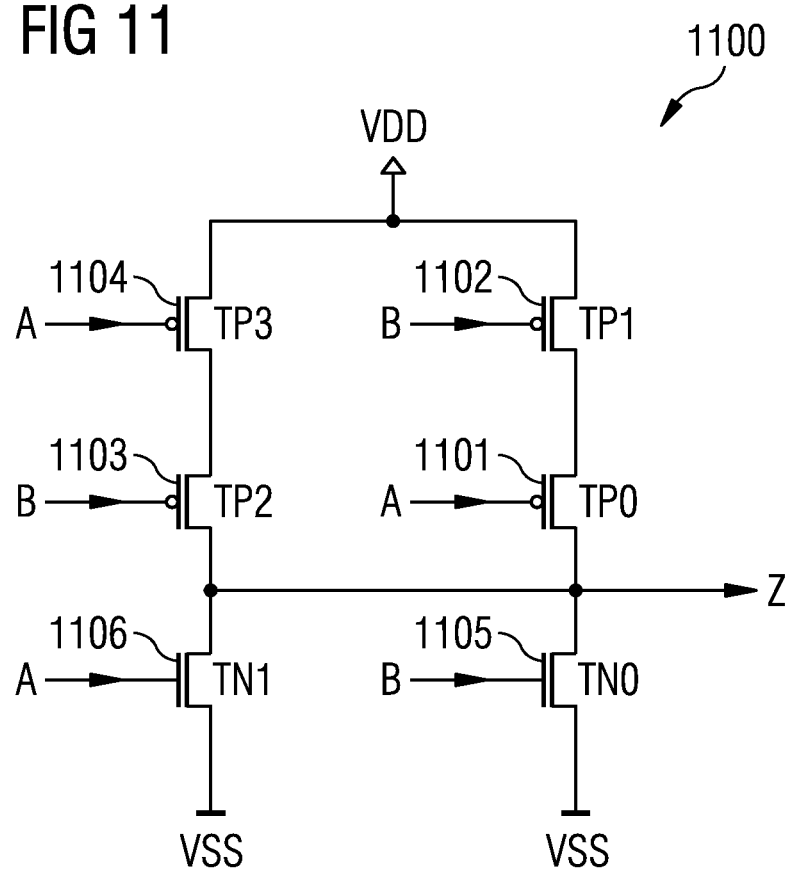
FIG. 11 shows a symmetrical NOR gate in accordance with an embodiment.

FIG. 11 shows a symmetrical NOR gate 1100.

The NOR gate 1100 has a first p-channel field effect transistor 1101, a second p-channel field effect transistor 1102, a third p-channel field effect transistor 1103, a fourth p-channel field effect transistor 1104, a first n-channel field effect transistor 1105 and a second n-channel field effect transistor 1106.

The first p-channel field effect transistor 1101, the fourth p-channel field effect transistor 1104 and the second n-channel field effect transistor 1106 receive the input signal A at their gate terminal.

The second p-channel field effect transistor 1102, the third p-channel field effect transistor 1103 and the first n-channel field effect transistor 1105 receive the input signal B at their gate terminal.

The source terminal of the second p-channel field effect transistor 1102 is coupled to the high supply potential VDD. The drain terminal of the second p-channel field effect transistor 1102 is coupled to the source terminal of the first p-channel field effect transistor 1101. The drain terminal of the first p-channel field effect transistor 1101 is coupled to the drain terminal of the first n-channel field effect transistor 1105, and the source terminal of the first n-channel field effect transistor 1105 is coupled to the low supply potential VSS.

The source terminal of the fourth p-channel field effect transistor 1104 is coupled to the high supply potential VDD. The drain terminal of the fourth p-channel field effect transistor 1104 is coupled to the source terminal of the third p-channel field effect transistor 1103. The drain terminal of the third p-channel field effect transistor 1103 is coupled to the drain terminal of the second n-channel field effect transistor 1106, and the source terminal of the second n-channel field effect transistor 1106 is coupled to the low supply potential VSS.

The drain terminals of the first p-channel field effect transistor 1101 and of the third p-channel field effect transistor 1103 are coupled to one another and form the output node of the NOR gate 1100.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A storage circuit comprising:
    an input stage configured to provide a value to be stored;
    a storage stage configured to store the value to be stored;
    an output stage configured to output a value stored by the storage circuit; and
    a control circuit configured to receive first and second output signals from the output stage, which signals indicate a charge state of the output stage, and, if the charge state of the output stage is equal to a predefined precharge state, to output an activation signal to the storage stage, wherein the storage stage is configured to store the value to be stored, provided by the input stage, in reaction to the activation signal,
    wherein the output stage comprises a first output configured to output the first output signal, and a second output configured to output the second output signal, the second output signal inverted relative to the first output signal, and
    wherein the control circuit configured to output the activation signal to the storage circuit if the first output signal output by the first output and the second output signal output by the second output are identical.

2. The storage circuit of claim 1,
    wherein the signals from the output stage constitute an output data signal of the storage circuit.

3. The storage circuit of claim 1,
    wherein the control circuit has a generating circuit configured to generate the activation signal from the output signals.

4. The storage circuit of claim 1,
    wherein the control circuit has a delay element configured to delay the outputting of the activation signal to the storage stage.

5. The storage circuit of claim 1,
    wherein the charge state of the output stage is equal to the predefined precharge state if the signal output by the first output and the signal output by the second output are equal to a predefined value.

6. The storage circuit of claim 1,
    wherein the charge state of the output stage is the charge state of at least one node of the output stage.

7. The storage circuit of claim 6,
    wherein the output stage is configured to receive a precharge signal and precharge the at least one node in reaction to the reception of the precharge signal.

8. The storage circuit of claim 7,
    wherein the control circuit is configured to generate the precharge signal.

9. The storage circuit of claim 8,
    wherein the control circuit is configured to generate the precharge signal in reaction to a clock signal.

10. The storage circuit of claim 1,
    wherein the storage stage is a slave flip-flop.

11. The storage circuit of claim 10, furthermore comprising:
    a master flip-flop configured to store the value to be stored, provided by the input stage, wherein the slave flip-flop is configured to receive and store the value provided by the input stage from the master flip-flop in reaction to the activation signal.

* * * * *